US006764884B1

(12) United States Patent
Yu et al.

(10) Patent No.: US 6,764,884 B1
(45) Date of Patent: Jul. 20, 2004

(54) METHOD FOR FORMING A GATE IN A FINFET DEVICE AND THINNING A FIN IN A CHANNEL REGION OF THE FINFET DEVICE

(75) Inventors: Bin Yu, Cupertino, CA (US); Haihong Wang, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/405,342

(22) Filed: Apr. 3, 2003

(51) Int. Cl.[7] .............................................. H01L 21/84
(52) U.S. Cl. ....................................... 438/157; 438/283
(58) Field of Search ................................ 438/151, 157, 438/279, 283

(56) References Cited

U.S. PATENT DOCUMENTS

| 6,225,173 B1 | * | 5/2001 | Yu ............................. 438/300 |
| 6,413,802 B1 | * | 7/2002 | Hu et al. .................... 438/283 |
| 6,583,469 B1 | * | 6/2003 | Fried et al. ................. 257/329 |

OTHER PUBLICATIONS

Co-pending U.S. application Ser. No. 10/726,619, filed Dec. 4, 2003; entitled: "Damascene Gate Semiconductor Processing with Local Thinning of Channel Region," 20 page specification, 12 sheets of drawings.

Co-pending U.S. application Ser. No. 10/754,540, filed Jan. 12, 2004; entitled: "Narrow–Body Damascene Tri–Gate FinFET," 13 page specification, 13 sheets of drawings.

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Chandra Chaudhari
(74) *Attorney, Agent, or Firm*—Harrity & Snyder LLP

(57) ABSTRACT

A method of manufacturing a FinFET device includes forming a fin structure on an insulating layer. The fin structure includes a conductive fin. The method also includes forming source/drain regions and forming a dummy gate over the fin. The dummy gate may be removed and the width of the fin in the channel region may be reduced. The method further includes depositing a gate material to replace the removed dummy gate.

20 Claims, 14 Drawing Sheets

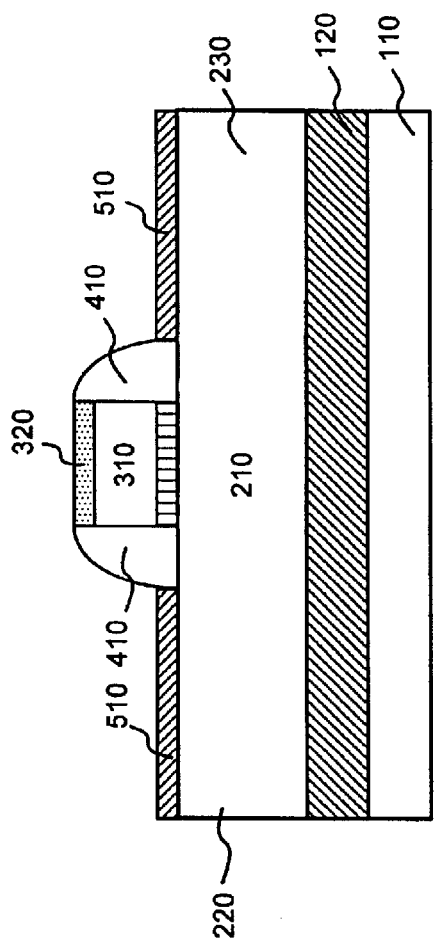
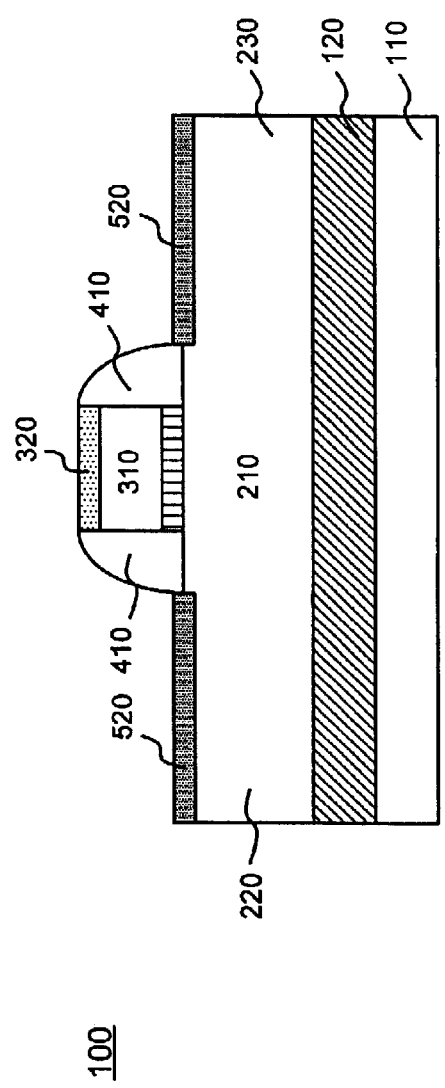

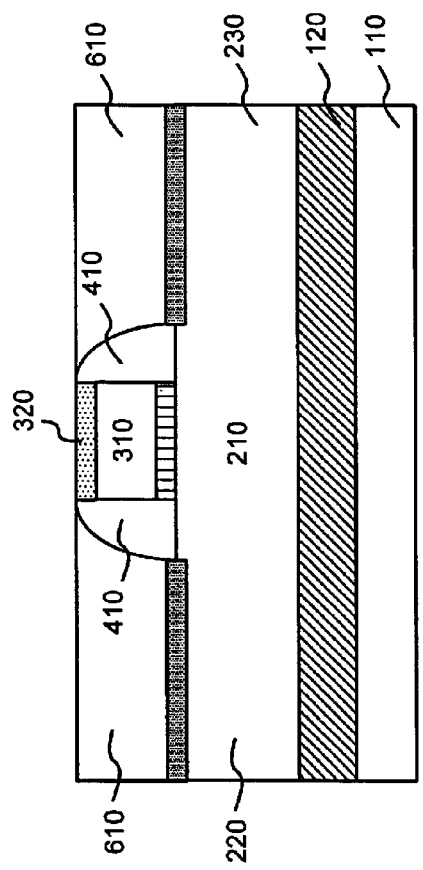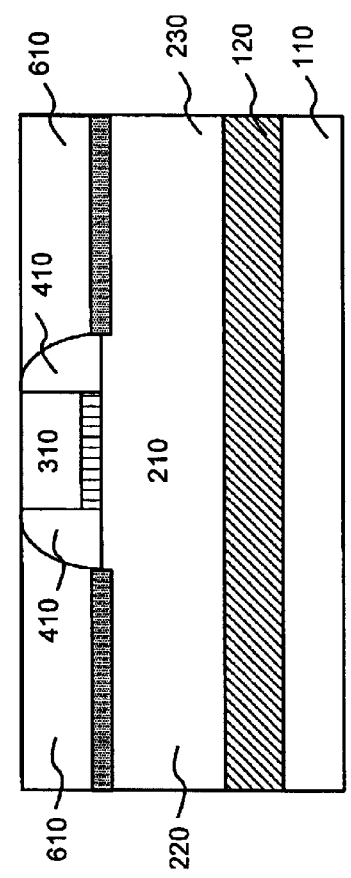

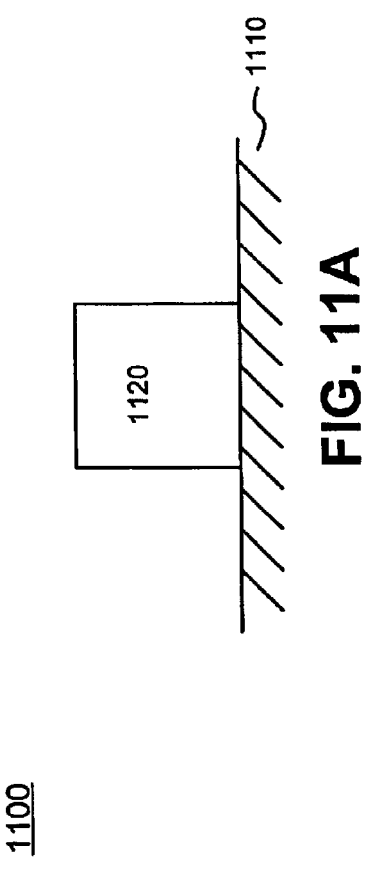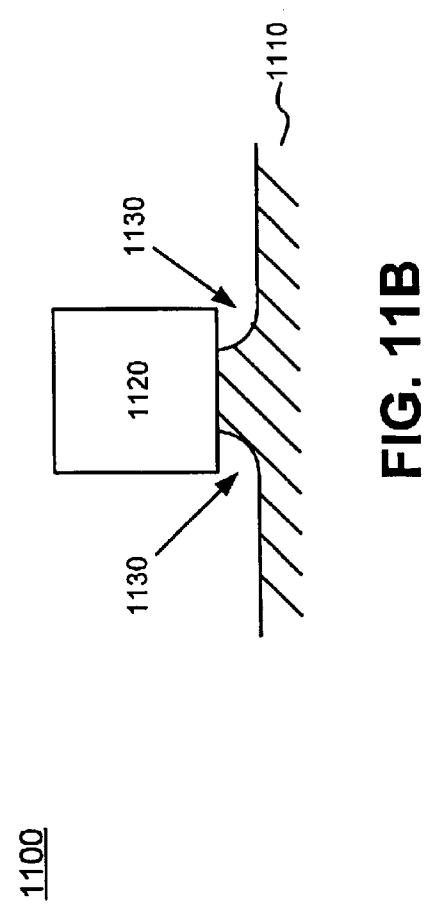

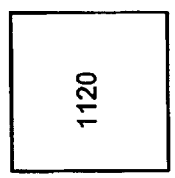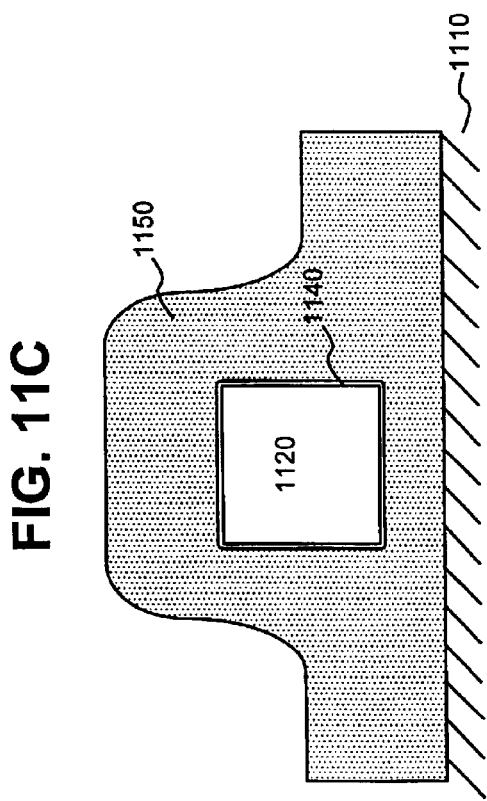
FIG. 11C
FIG. 11D

METHOD FOR FORMING A GATE IN A FINFET DEVICE AND THINNING A FIN IN A CHANNEL REGION OF THE FINFET DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide methodology for forming a gate and thing a fin in a FinFET device. The fin may be thinned in the channel region to reduce the width of the fin in that region of the FinFET device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming a gate in a FinFET device. The method includes depositing a first dielectric layer over a silicon on insulator (SOI) wafer, where the SOI wafer includes a silicon layer on an insulating layer. The method also includes forming a resist mask over a portion of the first dielectric layer, etching portions of the first dielectric layer and silicon layer not covered by the resist mask to form a fin and a dielectric cap covering a top surface of the fin. The method further includes depositing a gate layer over the dielectric cap, depositing a second dielectric layer over the gate layer, etching the gate layer and second dielectric layer to form a gate structure, forming sidewall spacers adjacent the gate structure and forming a third dielectric layer over the gate structure and sidewall spacers. The method also includes planarizing the third dielectric layer to expose a top surface of the second dielectric layer, removing the second dielectric layer and the gate layer in the gate structure, etching the fin to reduce a width of the fin in a channel region of the semiconductor device and depositing a gate material to replace the removed gate layer.

According to another aspect of the invention, a method of manufacturing a semiconductor device is provided. The method includes forming a fin structure on an insulating layer, where the fin structure includes a conductive fin. The method also includes forming source and drain regions, forming a gate over the fin structure and removing the gate to create a recessed area. The method further includes thinning a width of the fin in a channel region of the semiconductor device and depositing a metal in the recessed area.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 5A and 5B are cross-sections illustrating the formation of metal-silicide compound on the device of FIG. 4 in accordance with an exemplary embodiment of the invention.

FIG. 7A is a cross-section illustrating the planarizing of the dielectric layer on the device of FIG. 6 in accordance with an exemplary embodiment of the present invention.

FIG. 7B illustrates the removal of a portion of the dummy gate structure in accordance with an exemplary embodiment of the present invention.

FIGS. 11A–11D are cross-sections illustrating the formation of a gate-all-around structure in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide methods of manufacturing FinFET devices. In one implementation, a dummy gate may be formed in a gate area of a FinFET device. The dummy gate may be removed and the fin may be etched to reduce the width of the fin in the channel region of the FinFET device. A conductive material may then be deposited to form the gate.

Figure 1:
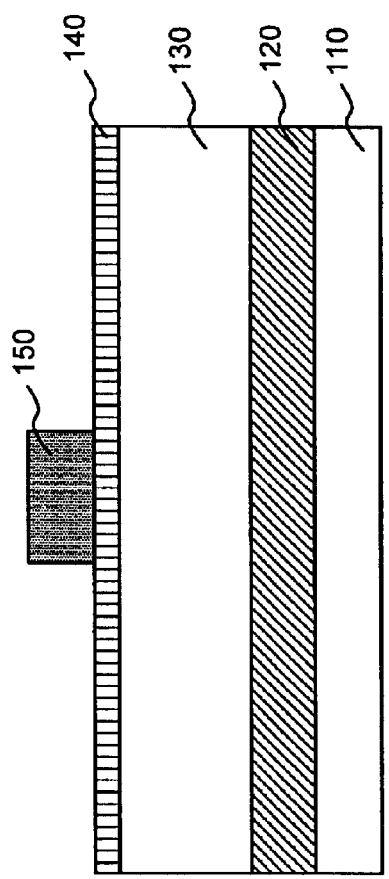
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer, may be formed over silicon layer 130 to act as a protective cap during subsequent etching processes. In an exemplary implementation, dielectric layer 140 may be deposited at a thickness ranging from about 100 Å to about 250 Å. Next, a photoresist material may be deposited and patterned to form a photoresist mask 150 for subsequent processing. The photoresist may be deposited and patterned in any conventional manner.

Figure 2A:
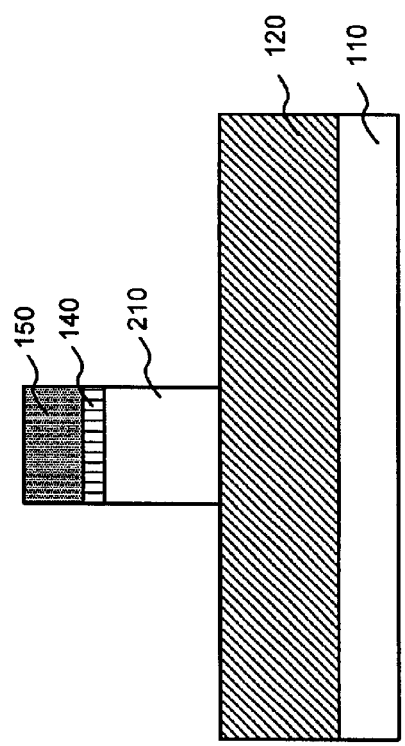
FIG. 2A is a cross-section illustrating the formation of a fin in accordance with an exemplary embodiment of the present invention.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, dielectric layer 140 and silicon layer 130 have been etched to form a fin 210 comprising silicon with a dielectric cap 140.

Figure 2B:
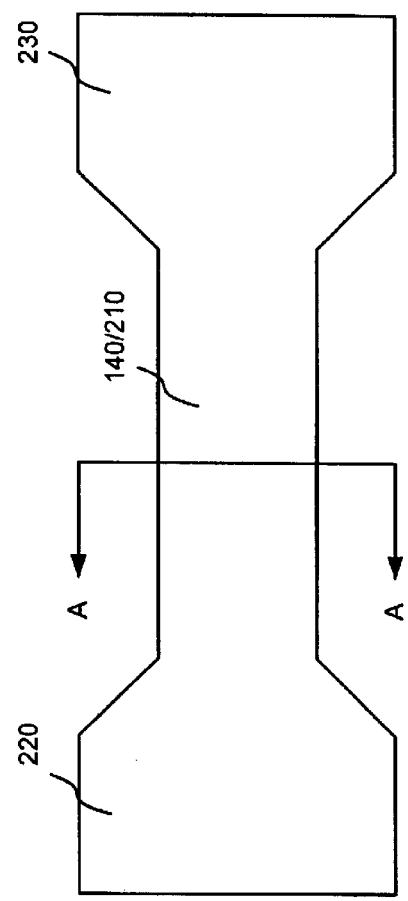
FIG. 2B schematically illustrates the top view of the semiconductor device of FIG. 2A in accordance with an exemplary embodiment of the present invention.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor 100 including source region 220 and drain region 230 formed adjacent fin 210 on buried oxide layer 120, according to an exemplary embodiment of the present invention. The top view in FIG. 2B is oriented such that the cross-section in FIG. 2A is taken along line AA in FIG. 2B. The photoresist mask 150 is not illustrated in FIG. 2B for simplicity.

Figure 3A:
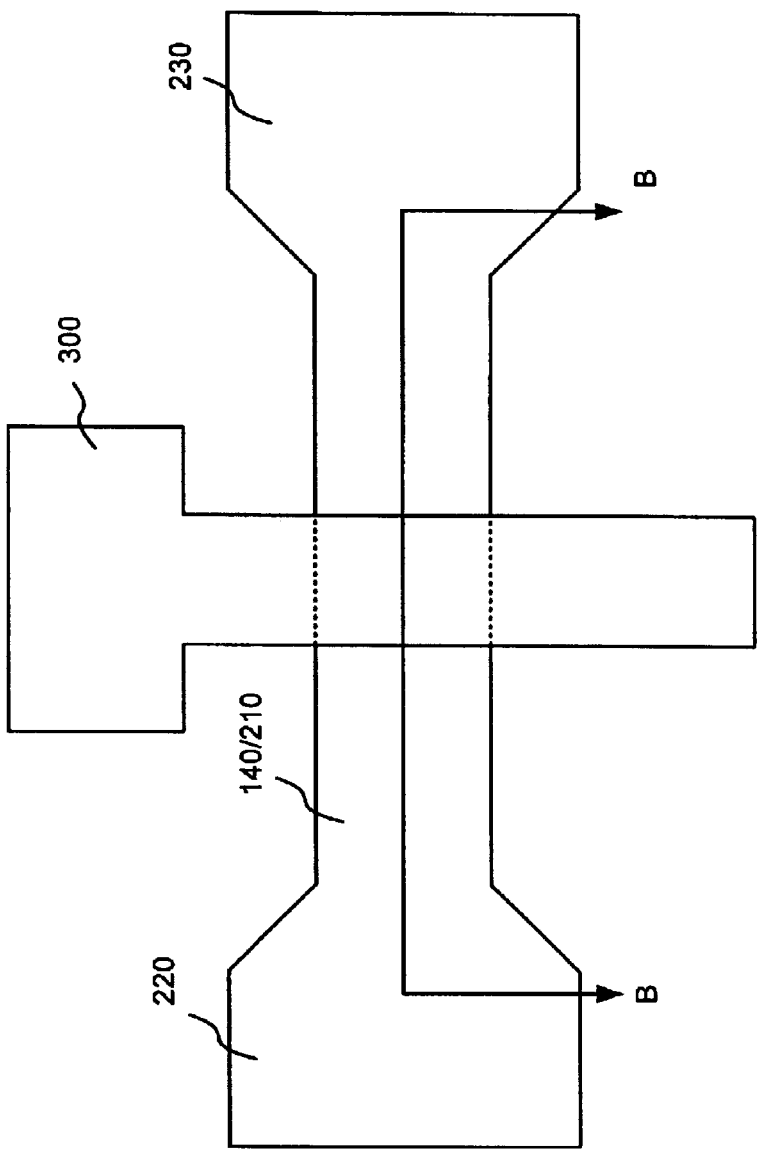
FIG. 3A is a top view illustrating the formation of a gate structure in accordance with an exemplary embodiment of the present invention.
Figure 3B:
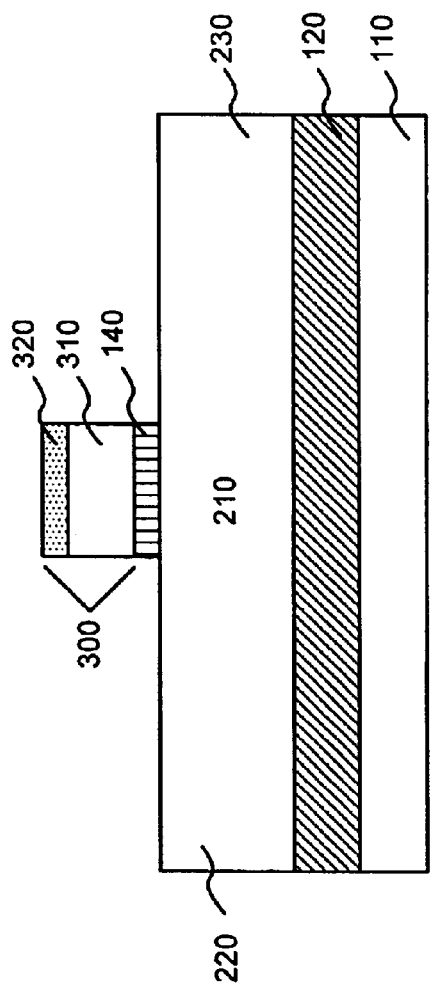
FIG. 3B is a cross-section illustrating the gate formation of FIG. 3A in accordance with an exemplary embodiment of the present invention.

The photoresist mask 150 may be removed and a gate structure may be formed on semiconductor device 100. The gate structure initially formed on semiconductor device 100 may be referred to as a "dummy gate" since this gate formation may be removed at a later time, as described in more detail below. In an exemplary implementation, a gate layer and a protective dielectric layer may be deposited over fin 210 and dielectric cap 140 and etched to form a dummy gate structure. FIG. 3A is a top view illustrating dummy gate 300. FIG. 3B is a cross-section of semiconductor device 100 taken along line BB in FIG. 3A after formation of the dummy gate 300. Referring to FIG. 3B, dummy gate 300 may include a polysilicon or amorphous silicon layer 310 and may have a thickness ranging from about 300 Å to about 1000 Å and a width ranging from about 50 Å to about 500 Å in a channel region of semiconductor device 100. Dummy gate 300 may also include a dielectric layer 320 that comprises, for example, silicon nitride and may have a thickness ranging from about 100 Å to about 300 Å. Dielectric layer 320 acts as a protective cap for silicon layer 310.

Figure 4:
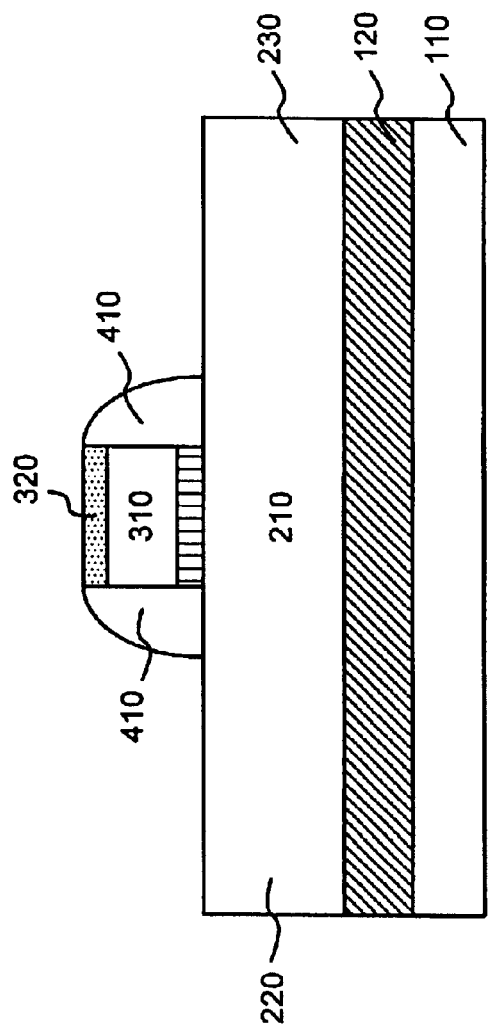
FIG. 4 is a cross-section illustrating the formation of sidewall spacers adjacent the gate structure in accordance with an exemplary embodiment of the present invention.
Figure 6:
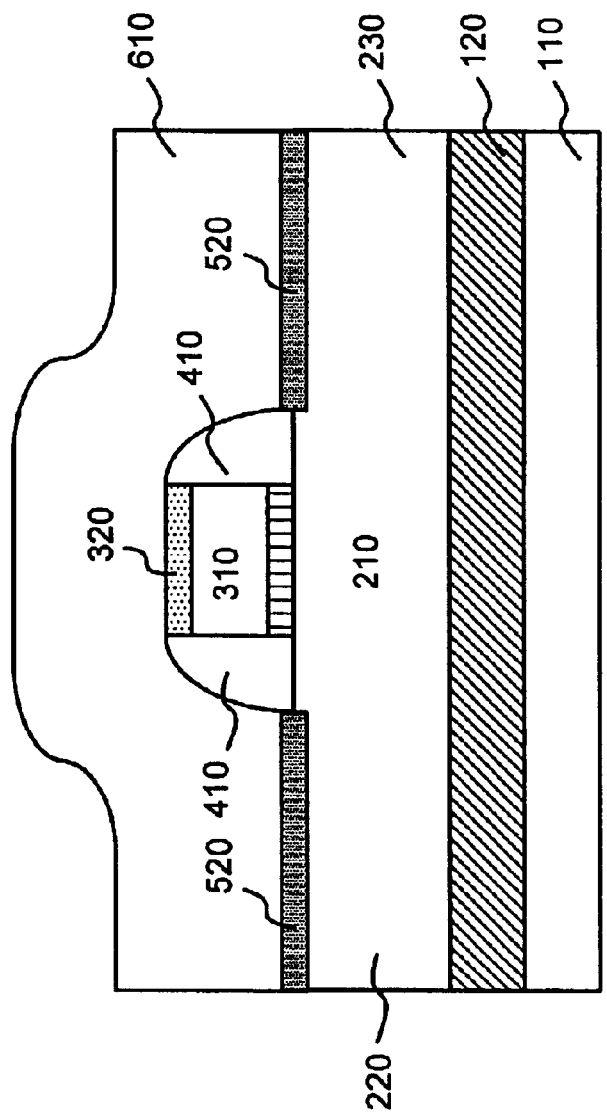
FIG. 6 is a cross-section illustrating the formation of a dielectric layer on the device of FIG. 5 in accordance with an exemplary embodiment of the present invention.

A dielectric layer may then be deposited and etched to form spacers 410 adjacent opposite sides of dummy gate 300, as illustrated in FIG. 4. Spacers 410 may comprise a silicon oxide (e.g., $SiO_2$) or another dielectric material. In an exemplary implementation, the width of spacers 410 may range from about 50 Å to about 1000 Å. Spacers 410 may protect underlying fin 210 during subsequent processing and facilitate doping of source/drain regions 220 and 230.

A metal layer 510 may be deposited over source/drain regions 220 and 230, as illustrated in FIG. 5A. In an exemplary implementation, metal layer 510 may include nickel, cobalt or another metal, and may be deposited to a thickness ranging from about 50 Å to about 200 Å. A thermal annealing may then be performed to form a metal-silicide layer 520, as illustrated in FIG. 5B. During the annealing, the metal may react with the silicon in source/drain regions 220 and 230 to form a metal-silicide compound, such as NiSi or $CoSi_2$, based on the particular metal layer 510 deposited.

Next, a dielectric layer 610 may be deposited over semiconductor device 100. In an exemplary implementation, dielectric layer 610 may include a tetraethyl orthosilicate (TEOS) compound and may be deposited to a thickness ranging from about 2000 Å to 3000 Å. In alternative implementations, other dielectric materials may be used. The dielectric layer 610 may then be planarized. For example, a chemical-mechanical polishing (CMP) may be performed to planarize the dielectric layer 610 with the upper surface of dielectric cap 320 and to expose the upper surface of dielectric cap 320, as illustrated in FIG. 7A. The dielectric cap 320 may then be removed using, for example, a wet etching procedure, as illustrated in FIG. 7B. In an exemplary implementation, the wet etch may use an acid, such as $H_3PO_4$, to remove dielectric cap 320. During the etching process to remove dielectric cap 320, an upper portion of spacers 410 and dielectric layer 610 may also removed such that the upper surface of silicon layer 310 is substantially planar with the upper surface of spacers 410 and dielectric layer 610, as illustrated in FIG. 7B.

Figure 8:
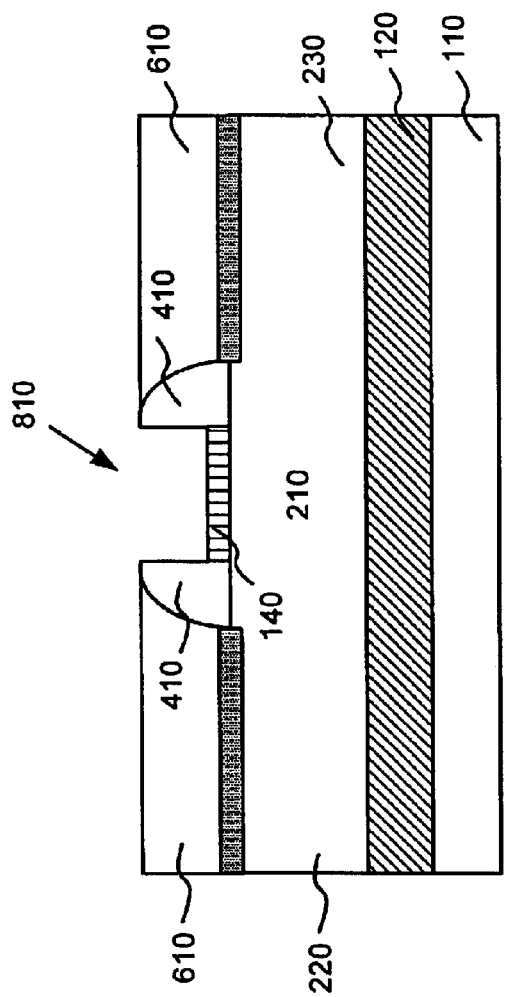
FIG. 8 illustrates the removal of another portion of the dummy gate structure in accordance with an exemplary embodiment of the present invention.

Silicon layer 310 may then be removed, as illustrated in FIG. 8. For example, silicon layer 310 may be etched using reactants that have a high etch selectivity with respect to polysilicon. This enables silicon material 310 to be removed without removing significant portions of any of the surrounding dielectric layers, such as spacers 410 and dielectric layer 140. After silicon layer 310 is removed, a gate opening or recess 810 is formed, as illustrated in FIG. 8. In other words, a gate-shaped space, referred to as gate recess 810, may be created in surrounding dielectric layer 610.

After the gate recess 810 is formed, the side surfaces of silicon fin may be exposed in the channel region of semiconductor device 100. Fin 210 may then be etched to reduce the width of fin 210 in the channel region. For example, a wet etch process may be performed to reduce the width of fin 210 in the channel region. Portions of fin 210 not in the channel region and source/drain regions 220 and 230 are covered by dielectric layer 610, which prevents those portions of semiconductor device 100 from being etched while the desired portion of fin 210 is thinned.

Figure 9:
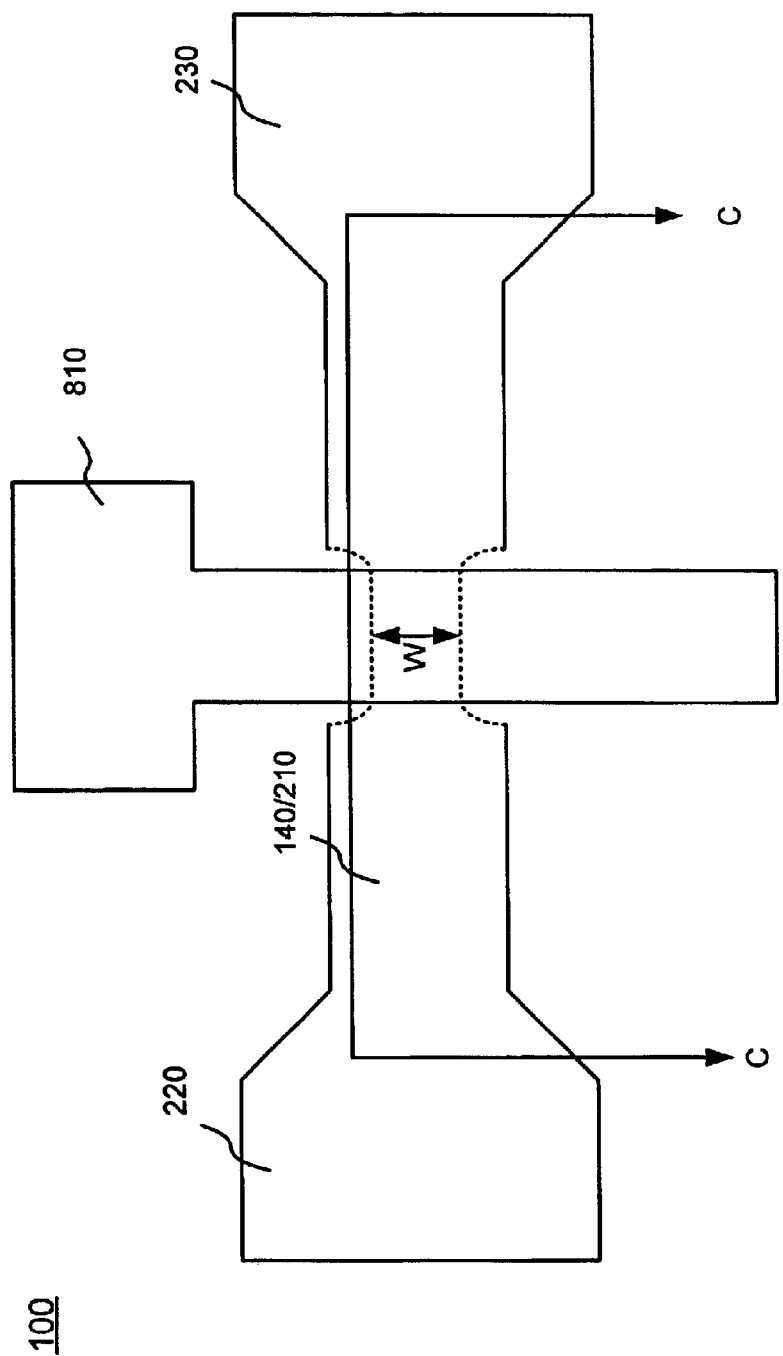
FIG. 9 is a cross-section illustrating the thinning of the fin in a channel region in accordance with an exemplary embodiment of the present invention.

FIG. 9 illustrates a top view of semiconductor device 100 after the etching. Referring to FIG. 9, the dotted lines illustrate the thinned portion of fin 210 in the channel region. In an exemplary implementation, the overall width of fin 210 may be reduced by about 20 nanometers (nm) to 100 nm as a result of the etching. The width of fin 210 in the channel region after the etching, labeled as W in FIG. 9, may range from about 30 Å to about 500 Å, in an exemplary implementation of the present invention. It should be understood that the width of fin 210 may depend on the particular device requirements and other parameters, such as the gate length. Area 810 in FIG. 9 illustrates the gate recess after removal of the dummy gate 300. The dielectric layer 610 and sidewall spacers 410 are not shown in FIG. 9 for simplicity.

Advantageously, thinning the width of fin 210 in the channel region enables the semiconductor device 100 to achieve good short channel control. For example, in some implementations, it may be desirable for the width of fin 210 to be less than the length of the gate, such as less than one half of the gate length. It is very difficult to achieve such parameters using conventional lithography. In other words, forming fin 210 as described above with respect to FIGS. 1 and 2A makes it very difficult to achieve a silicon fin with the desirably small width. The present invention forms the fin 210 and dummy gate 300 in the manner described above and then removes the dummy gate and thins the fin. This results in a desirably narrow fin, while avoiding processing difficulties associated with trying to achieve such a thin fin using lithography alone.

In addition, since the thinning of fin 210 may be performed using a wet etch process, the side surfaces of fin 210 may be smoother and more uniform than those achieved using lithography alone. These smoother side surfaces of fin 210 may improve carrier mobility of the vertically-oriented channels of semiconductor device 100.

Figure 10A:
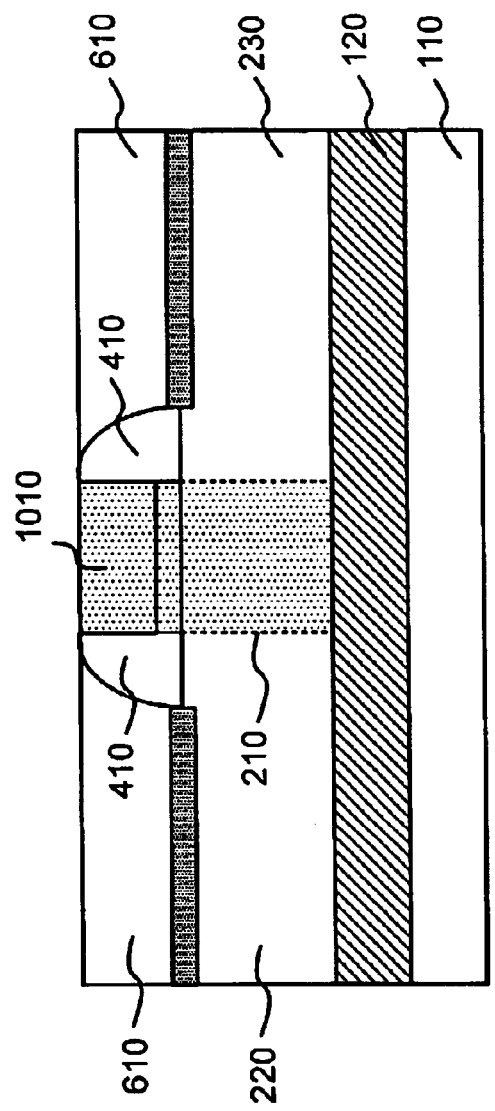
FIG. 10A is a cross-section illustrating the formation of a gate in accordance with an exemplary embodiment of the present invention.

A metal layer 1010 may then be deposited to fill the gate recess 810, as illustrated in FIG. 10A. FIG. 10A is a cross-section taken along line CC in FIG. 9. The metal material may comprise tungsten (W), tantalum (Ta), titanium (Ti), nickel (Ni), TaSiN, TaN, or some other metal, and may be deposited to a thickness ranging from about 200 Å to about 1000 Å. Semiconducting materials, such as silicon or germanium may also be used as the gate material. The metal layer 1010 may be polished so that the metal is substantially planar with the upper surface of spacers 410, as illustrated in FIG. 10A. The dotted lines in FIG. 10A illustrate the channel region of fin 210.

Figure 10B:
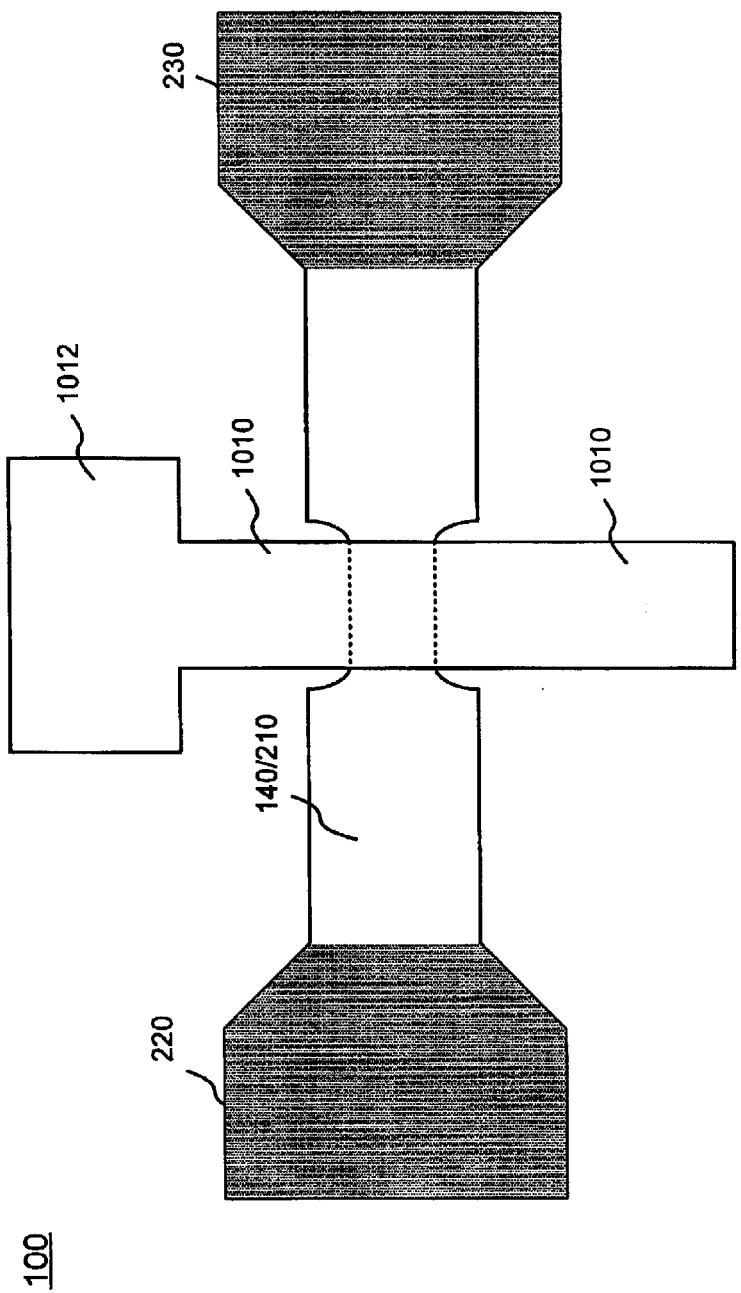
FIG. 10B is a top view illustrating the semiconductor device of FIG. 10A in accordance with an exemplary embodiment of the present invention.

FIG. 10B illustrates a top view of the semiconductor device 100 consistent with the present invention after the gate material 1010 has been deposited and planarized. As illustrated, semiconductor device 100 includes a double-gate structure with gate 1010 being disposed on either side of fin 210. The shaded areas in FIG. 10B represent the metal-silicide layer 520 formed over source/drain regions 220 and 230. Gate 1010 may include a gate electrode or contact, illustrated as gate electrode 1012 in FIG. 10B, formed at one end of gate 1010. In addition, a second gate electrode/contact may be formed at the opposite end of gate 1010.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such steps are not disclosed herein in order not to unduly obscure the thrust of the present invention. Sidewall spacers 410 aid in controlling the location of the source/drain junctions by shielding portions of fin 210 in the channel region from being implanted with impurities. Activation annealing may then be performed to activate the source/drain regions 220 and 230.

The resulting semiconductor device 100 illustrated in FIG. 10B is a double-gate device with gate 1010 extending over fin 210. In some implementations consistent with the present invention, the semiconductor device 100 illustrated in FIG. 10A may be planarized, via for example, a chemical-mechanical polishing (CMP), to remove the portion of gate layer 1010 above fin 210. In this implementation, electrically and physically separated gates may be formed on either side of fin 210. Such gates may be separately biased during operation of semiconductor device 100.

Thus, in accordance with the present invention, a double-gate FinFET device is formed with a thin fin in the channel region of the FinFET device. The resulting structure exhibits good short channel behavior. In addition, the metal gate reduces gate resistance and avoids poly depletion problems associated with polysilicon gates. The present invention can also be easily integrated into conventional semiconductor fabrication processing.

Other Exemplary Embodiment

In other embodiments of the present invention, a gate-all-around MOSFET may be formed. For example, FIG. 11A illustrates a cross-sectional view of a FinFET device 1100 that includes a buried oxide layer 1110 formed on a substrate (not shown) with a fin 1020 formed thereon. A dry etch process may be performed to etch a portion of buried oxide layer 1110, as illustrated in FIG. 11B. During the etching, a portion of buried oxide layer 1110 located below fin 1120 may be removed. In other words, the etching may laterally undercut a portion of buried oxide layer 1110 located below fin 1120, indicated by areas 1130 in FIG. 11B.

A second etch, such as a wet etch, may then be performed to etch the remaining portion of buried oxide layer 1110 located below fin 1120, as illustrated in FIG. 11C. The wet etch may laterally undercut the portion of buried oxide layer 1110 located below fin 1120, effectively suspending the fin 1120 over buried oxide layer 1110 in the channel region. The fin 1120, however, remains connected to the other portions of fin 1020 that are formed on buried oxide layer 1110 and are connected to the source and drain regions (not shown).

A gate oxide layer 1140 may then be formed on the exposed surfaces of fin 1120, as illustrated in FIG. 11D. A gate layer 1150 may then be deposited over fin 1120, as illustrated in FIG. 11D. The gate layer 1150 may surround the fin 1120 in the channel region of the semiconductor device 1100. The resulting semiconductor device 1100 is a gate-all-around FinFET with gate material surrounding the fin in the channel region of semiconductor device 1100.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 10B has been described, it should be understood that the order of the processes may be varied in other implementations consistent with the present invention.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a gate in a FinFET device, comprising:

depositing a first dielectric layer over a silicon on insulator (SOI) wafer, the SOI wafer comprising a silicon layer on an insulating layer;

forming a resist mask over a portion of the first dielectric layer;

etching portions of the first dielectric layer and silicon layer not covered by the resist mask to form a fin and a dielectric cap covering a top surface of the fin;

depositing a gate layer over the dielectric cap;

depositing a second dielectric layer over the gate layer;

etching the gate layer and second dielectric layer to form a gate structure;

forming sidewall spacers adjacent the gate structure;

forming a third dielectric layer over the FinFET device;

planarizing the third dielectric layer to expose a top surface of the second dielectric layer;

removing the second dielectric layer and the gate layer in the gate structure;

etching the fin to reduce a width of the fin in a channel region of the semiconductor device; and depositing a gate material to replace the removed gate layer.

2. The method of claim 1, further comprising:

planarizing the gate material such that the gate material is substantially planar with upper surfaces of the sidewall spacers.

3. The method of claim 1, wherein the etching the fin includes: wet etching the fin.

4. The method of claim 1, wherein the etching the fin reduces the width of the fin in the channel region by an amount ranging from about 20 nm to about 100 nm.

5. The method of claim 1, further comprising:

forming a source region on the insulating layer adjacent a first end of the fin; and forming a drain region on the insulating layer adjacent a second end of the fin.

6. The method of claim 5, further comprising:

depositing a metal over the source and drain regions; and annealing the semiconductor device to form a metal-silicide compound over the source and drain regions.

7. The method of claim 1, wherein the removing the gate layer includes:

etching the gate layer using an etch chemistry having a high etch selectivity for the gate layer relative to the first dielectric layer and the sidewall spacers.

8. The method of claim 1, wherein the depositing a gate material comprises:

depositing at least one of W, Ti, Ni, TaN and TaSiN.

9. A method of manufacturing a semiconductor device, comprising:

forming a fin on an insulating layer;

forming source and drain regions;

depositing a gate material over the fin;

patterning and etching the gate material to form a gate structure comprising the gate material;

forming a dielectric layer over the semiconductor device;

planarizing the dielectric layer to expose a top surface of the gate structure;

removing the gate material in the gate structure to form a recessed area;

reducing a width of the fin in a channel region of the semiconductor device; and depositing a metal in the recessed area.

10. The method of claim 9, further comprising:

planarizing the metal.

11. The method of claim 9, wherein the reducing the width of the fin includes:
  etching the fin to reduce the width of the fin in the channel region by an amount ranging from about 20 nm to 100 nm.

12. The method of claim 11, wherein the etching the fin includes: etching the fin using an acid.

13. The method of claim 9, wherein the dielectric layer comprises a tetraethyl orthosilicate (TEOS) material.

14. The method of claim 9, wherein the gate material comprises silicon and the removing the gate material comprises:
  etching the gate material using an etch chemistry having a high etch selectivity with respect to silicon.

15. A method of manufacturing a semiconductor device, comprising:
  forming a fin structure on an insulating layer, the fin structure comprising a conductive fin;
  forming source and drain regions;
  forming a gate over the fin structure;
  forming a dielectric layer over the semiconductor device;
  planarizing the dielectric layer to expose a top surface of the gate;
  removing the gate to create a recessed area;
  thinning a width of the fin in a channel region of the semiconductor device; and
  depositing a metal in the recessed area.

16. The method of claim 15, further comprising:
  planarizing the metal to form at least one gate electrode.

17. The method of claim 15, wherein the thinning the width of the fin comprises:
  wet etching the fin.

18. The method of claim 15, further comprising:
  depositing a metal over the source and drain regions; and
  annealing the semiconductor device to form a metal-silicide compound over the source and drain regions.

19. The method of claim 15, wherein the metal comprises at least one of tungsten, titanium, nickel tantalum.

20. The method of claim 15, wherein the thinning the width of the fin comprises:
  reducing the fin by an amount ranging from 20 nm to 100 nm.

* * * * *

UNITED STATES PATENT AND TRADEMARK OFFICE
CERTIFICATE OF CORRECTION

PATENT NO. : 6,764,884 B1
DATED : July 20, 2004
INVENTOR(S) : Bin Yu and Haihong Wang It is certified that error appears in the above-identified patent and that said Letters Patent is hereby corrected as shown below:

Column 1,
Line 44, change the word "thing" to -- thinning --.

Column 10,
Line 18, insert the word -- and -- after the word "nickel".
Line 20, insert the phrase -- width of the -- before the word "fin".

Signed and Sealed this

First Day of February, 2005

JON W. DUDAS
*Director of the United States Patent and Trademark Office*